(12) United States Patent
Kroon

(10) Patent No.: US 7,274,432 B2
(45) Date of Patent: Sep. 25, 2007

(54) RADIATION SYSTEM, LITHOGRAPHIC APPARATUS, DEVICE MANUFACTURING METHOD, AND DEVICE MANUFACTURED THEREBY

(75) Inventor: Mark Kroon, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 161 days.

(21) Appl. No.: 10/976,156

(22) Filed: Oct. 29, 2004

(65) Prior Publication Data

US 2006/0091327 A1    May 4, 2006

(51) Int. Cl.
*G02B 6/32* (2006.01)

(52) U.S. Cl. .............................. 355/30; 355/53; 359/11; 359/22

(58) Field of Classification Search ................. 355/67, 355/53, 30; 359/204, 216, 11, 22; 347/243, 347/244; 250/492.2, 504 R
See application file for complete search history.

(56) References Cited

U.S. PATENT DOCUMENTS 6,559,998 B2 *   5/2003   Yamakawa .................. 359/204
6,885,432 B2 *   4/2005   Tsuji ............................ 355/67

* cited by examiner

*Primary Examiner*—Kiet T. Nguyen
(74) *Attorney, Agent, or Firm*—Pillsbury Winthrop Shaw Pittman LLP

(57) ABSTRACT

A radiation system for multiplexing radiation includes two radiation sub-sources. The sub-sources each provide a certain amount of radiation. The system further includes a member with reflecting surfaces. The surfaces are arranged in such a way that they receive the radiation from the sub-sources and combine this radiation. The radiation sub-sources may operate simultaneously or alternately. The surfaces may perform functions such as filtering or (de) magnifying.

22 Claims, 2 Drawing Sheets

RADIATION SYSTEM, LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a radiation system, a lithographic apparatus, a device manufacturing method, and a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam of radiation in a given direction (the "scanning" direction) while synchronously scanning the substrate parallel or anti-parallel to this direction.

A lithographic apparatus as described above usually includes an illumination system and a radiation source. The radiation source provides the required radiation for irradiating the patterning device.

A problem in presently available EUV illumination systems is that non-linear effects occur when a high power EUV radiation beam is generated. These known illumination systems employ a radiation source with a laser produced plasma (LPP) or discharge produced plasma (DPP). Several problems are associated with radiation sources with a laser produced plasma when high power is involved: nozzle degradation, nozzle material sputtering, nozzle thermal load, gas recycling, vacuum system gas load, low repetition rate, low conversion efficiency, inhomogeneous emission profiles, etc. Current problems with discharge produced plasma at higher powers are: extended source size, elongated shape of the radiation source, pinch size depending on all system parameters, low conversion efficiency, etc.

SUMMARY OF THE INVENTION

Some of the benefits of the present invention are that a radiation system can be provided that has, amongst other things, a relatively large yield, generates a reduced amount of out-of-band radiation and a reduced amount of fast particles that may sputter entities (e.g. optical systems) positioned downstream of the radiation system, than is presently available.

It is possible to multiplex radiation, as disclosed for example in European Patent Application 03255825.6, filed Sep. 17, 2003 in the name of the applicant, the entire contents of which are incorporated by reference.

One aspect of the present invention relates to a system for multiplexing radiation, the radiation system including a first radiation source configured to provide radiation and a second radiation source configured to provide radiation. It is suitable for EUV radiation sources, but is not restricted thereto.

The system of the present invention in one embodiment includes an optical member with a first reflecting surface and a second reflecting surface. The first reflecting surface is configured to receive a first amount of radiation from the first radiation source and reflect the first amount and the second reflecting surface is configured to receive a second amount of radiation from the second radiation source and reflect the second amount. As it possible to employ smaller sources, a reduction of strongly non-linear effects per individual source is obtained. Additionally, the smaller sources may run at low pulse energy and peak power. The active volume of these sources is comparable to larger sources. Smaller sources allow for a more controlled and more stable operation. Problems in connection with thermal dissipation and heat removal and transportation management are reduced. The same holds for problems in connection with delivery of source gases, power, electrode erosion and system contamination. The first source and the second source will generate in total less particles and cause less sputtering of downstream optical components compared to one bigger radiation source after power scale up. Less alignment is necessary for the member compared to individual mirrors.

In an embodiment of the present invention, the optical member includes a conical shape or a polygonal shaped cross-section. Such a member may be made with a precision workbench. Such a member is at the same time both robust and simple.

In a further embodiment, at least one of the first reflecting surface and the second reflecting surface is positioned at grazing incidence with the first amount and the second amount, respectively. Such an arrangement makes the invention suitable for use in connection with (E)UV radiation.

In a further embodiment, the first radiation source is configured to be operated substantially simultaneously with the second radiation source. This enables spatial multiplexing of radiation and a more homogeneously filled aperture.

In a further embodiment, the first radiation source is configured to be operated alternately with the second radiation source. This provides a more stable output in time and effectively a higher pulse frequency. It makes the multiplexing of radiation in the time domain possible.

In a further embodiment, at least one of the first radiation source and the second radiation source includes an electrical discharge plasma, a Z pinch discharge plasma, a discharge produced plasma (DPP), a laser produced plasma (LPP) and a dense plasma focus, an ultraviolet (UV) radiation source, an extreme ultra-violet (EUV) radiation source, an X-ray radiation source, a radiation source generating particle beams, a radiation source generating ion beams, or a radiation source generating electron beams. These are readily available (E)UV sources.

In a further embodiment, at least one of the first reflecting surface and the second reflecting surface includes a spectral purity filter, a surface coating, a grating, or a specific absorption and diffraction structure. In this way the reflecting surface reflect and perform at the same time another function, for example filtering and/or absorbing.

In a further embodiment, at least one of the first reflecting surface and the second reflecting surface is curved. The curvature of the reflecting surfaces makes manipulation i.e. increase or decrease of the cross section of the radiation beam from the respective sources, possible.

The invention also relates to a lithographic apparatus including a system as described above.

The invention also relates to a device manufacturing method including providing a beam of radiation of radiation as described above; patterning the beam of radiation with a pattern in its cross-section; and projecting the patterned beam of radiation onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as X-ray radiation and particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bares the weight of, the patterning device. It holds the patterning device in a way depending on the orientation of the patterning device, the design of the lithographic apparatus, and other conditions, for example whether or not the patterning device is held in a vacuum environment. The support may use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
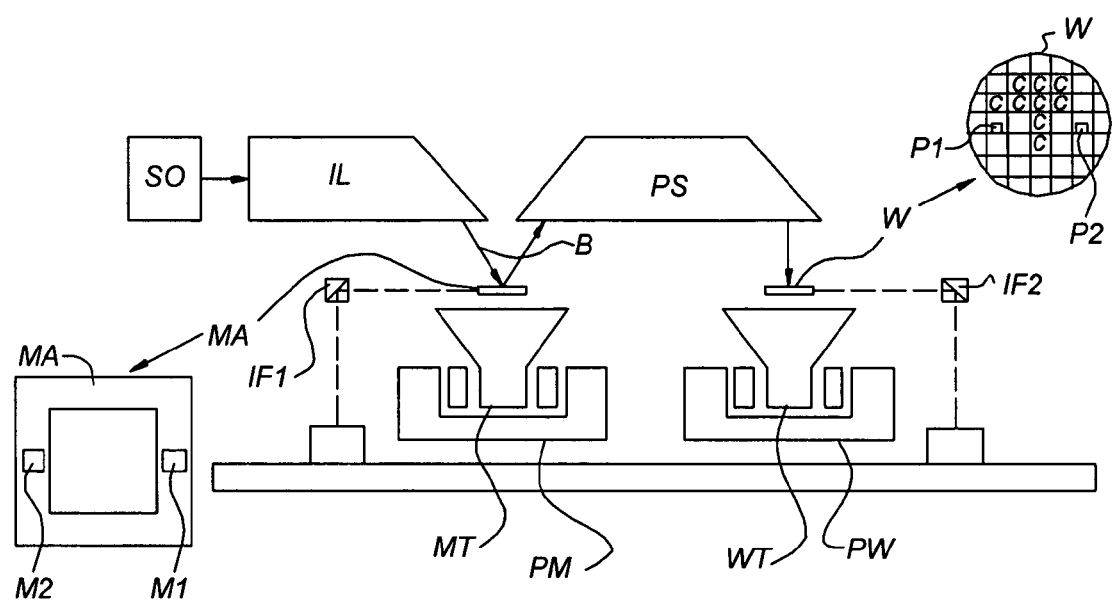
FIG. 1 depicts a lithographic apparatus according to an embodiment of the present invention.

FIG. 1 schematically depicts a lithographic apparatus according to a particular embodiment of the invention. The apparatus includes an illumination system (illuminator) IL configured to provide a beam of radiation PB of radiation (e.g. UV or EUV radiation). A support (e.g. a mask table) MT is configured to support a patterning device (e.g. a mask) MA and is connected to a first positioning device PM that accurately positions the patterning device with respect to a projection system PS. A substrate table (e.g. a wafer table) WT is configured to hold a substrate (e.g. a resist-coated wafer) W and is connected to second positioning device PW that accurately positions the substrate with respect to the projection system PS. The projection system (e.g. a reflective projection lens) PS is configured to image a pattern imparted to the beam of radiation PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL may be referred to as a radiation system.

The illuminator IL may include an adjusting device(s) to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam of radiation PB is incident on the mask MA, which is held on the mask table MT. Being reflected by the mask MA, the beam of radiation PB passes through the projection system PS, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
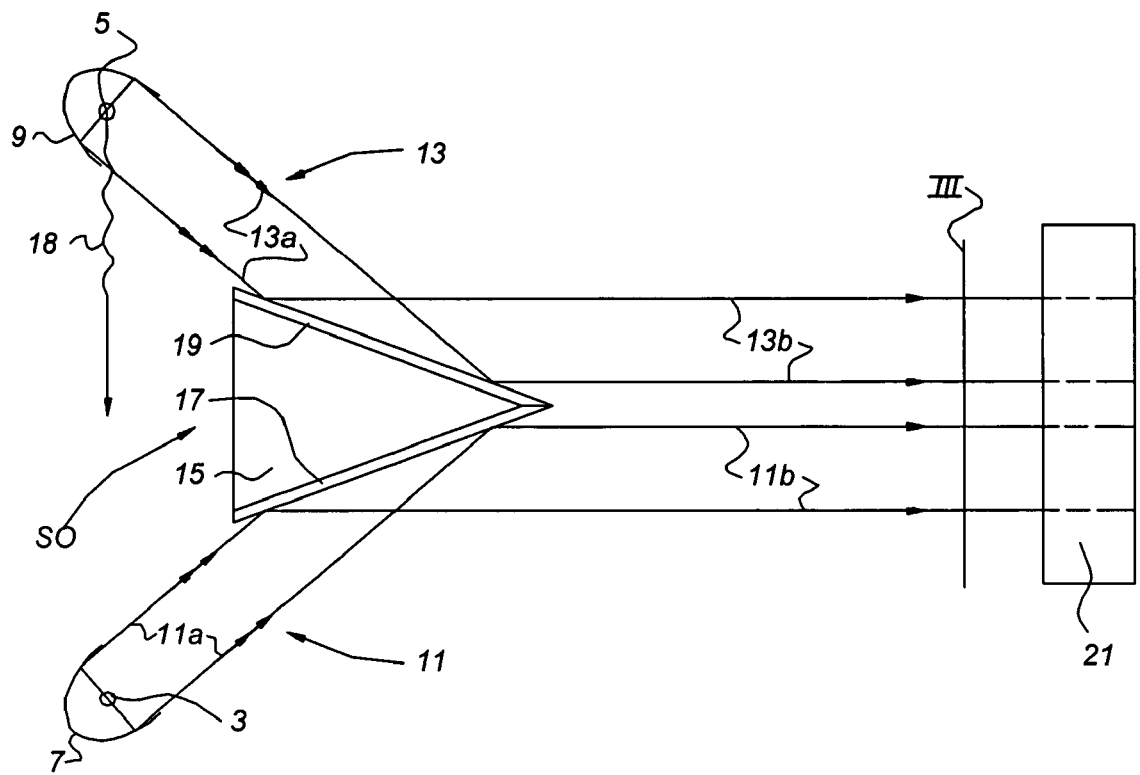
FIG. 2 depicts a system for multiplexing radiation according to an embodiment of the present invention.

Referring to FIG. 2, radiation is multiplexed in the source SO. Radiation of radiation sub-sources is combined into one composite radiation beam. The source SO will therefore include several radiation sub-sources. In FIG. 2, for purpose of illustration, only a radiation sub-source 3 and a radiation sub-source 5 are shown. The present invention, however, is not limited to a source SO with only two radiation sub-sources. In the vicinity of the radiation sub-source 3, a collector 7 is present. In the vicinity of the radiation sub-source 5, a collector 9 is present. The collector 7 and the collector 9 as shown in FIG. 2 are parabolic. The radiation sub-source 3 and the radiation sub-source 5, respectively, may be located in the focal point of the respective collectors 7 and 9. In this case, the radiation form the respective radiation sub-sources 3 and 5 will emerge parallel as long as it hits the respective collectors 7 and 9. As an example, a beam 18 that does not hit the collector 9 is shown in FIG. 2. The radiation power of this beam 18 does not contribute to the amount of radiation power of the combined composite beam, as discussed below. It should be appreciated that differently shaped collectors e.g. elliptical, circular or else are also possible. Radiation, in particular extreme ultra violet (EUV) radiation, emanates from the radiation sub-source 3 and from the radiation sub-source 5. The source SO further includes a member 15 with two reflecting surfaces 17, 19, respectively. Note that, when there are more than two sub-sources 3, 5 there will, generally, be more than two reflecting surfaces 17, 19. A beam of radiation 11 as produced by radiation sub-source 3 upstream from the reflective surface 17 is referred to with reference numeral 11a and downstream from the reflective surface 17 with reference numeral 11b. A beam of radiation 13 as produced by radiation sub-source 5 upstream from the reflective surface 19 is referred to with reference numeral 13a and downstream from the reflective surface 19 with reference numeral 13b. The beams 11b, 13b may impinge on an optical system 21.

The source SO according to this embodiment functions in the following way. The radiation sub-source 3 and the radiation sub-source 5, respectively, direct divergent radiation to the parabolic collectors 7 and 9, respectively. At least some part of the radiation emanates from the reflective surface 17 and 19, respectively, as a beam of radiation 11a and 13a, respectively, that is parallel, if the radiation sub-sources 3 and 5 respectively are located in the focal points of the parabolical collectors 7 and 9, respectively. The beams 11a and 13a, respectively, are reflected by the reflective surfaces 17 and 19, respectively, and two mutually parallel beams 11b and 13b result. The combined power of the beams 11b and 13b may be supplied subsequently to the optical system 21 downstream. Such an optical system 21 may be an integrator that has an integrating function such that a single radiation beam is formed and used to project a pattern on patterning device to a substrate. Alternatively, a fly-eye scrambler may be present as the optical system 21 to mix the signature of the individual sub-sources 3 and 5 such that uniform radiation density is obtained in time and space before the beam enters the illuminator IL.

Although this embodiment has been described for parallel beams 11*b* and 13*b* of radiation, this embodiment covers the case in which the beams 11*b* and 13*b* are not parallel after reflection from the reflective member 15, for example beams that converge into a focus. Also, one or both of the radiation sources 3 and 5 may not be located in the focal points of the parabolic collectors 7 or 9. Then the beams of radiation 11*a* and/or 13*a* will be divergent and/or convergent in character. This embodiment covers these cases as well.

The reflective member 15 may be of a conical shape. An advantage is that such conically shaped objects are easily produced by mechanical workbenches. In addition, the member 15 may also include a polygonal shaped cross-section.

The source SO can be used with all types of electromagnetic radiation. When this source SO is used in connection with radiation in the EUV range of the electromagnetic spectrum, it is recommended to let the beams of radiation 11*a*, 13*a* impinge under grazing incidence on the reflective surfaces 17, 19. This means that the angle with respect to surface 17, 19 is as small as possible. The reflection in this case will be the biggest and the absorption the smallest. Normally, the radiation sources 3 and 5 will be incoherent. However, when the radiation sources are coherent, both peak values and focussing will be enhanced by interference.

Figure 3:
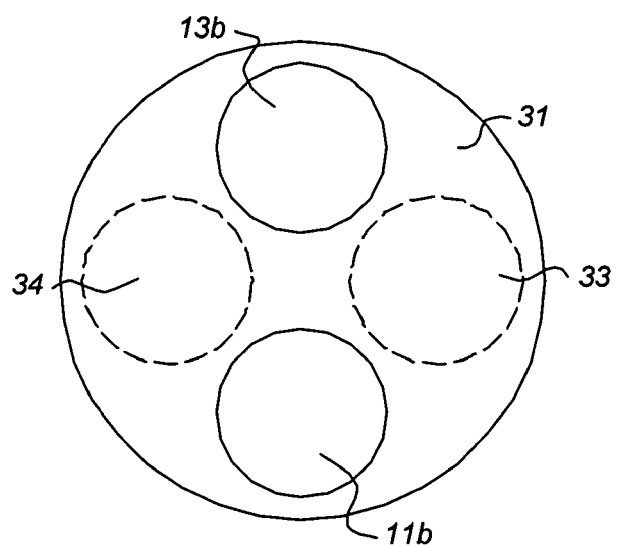
FIG. 3 shows a cross-section along line III-III shown in FIG. 2.

FIG. 3 is a view along the line III-III in FIG. 2 of a combined beam of radiation filling an aperture 31. The combined beam includes the beams 11*b* and 13*b* shown in FIG. 2. An additional beam 33 and an additional beam 34 may be present. These additional beams 33, 34 are drawn with a dashed line in FIG. 3. These additional beams 33, 34 may be provided by other radiation sources (not shown). By operating the various radiation sources at the same time, the combined power of the separate radiation sources is imparted to the aperture 31.

Radiation sources providing EUV radiation are generally pulsed. As an alternative to the embodiments described above, a composite radiation source with an increased frequency may be obtained by operating the radiation sources on a one by one basis. In this case, for example, the radiation sources providing the beams of radiation 13*b*, 33, 11*b* and 34 are operated one-by-one in time. This provides a partly filled aperture 31 at any moment in time, however, at an increased frequency. Then, the optical system 21 may be a scrambler arranged to scramble the optical power over the aperture 31.

The radiation sources used in the present invention may be anyone of the several plasma based radiation sources that are regularly available, for example: an electrical discharge plasma, a Z pinch discharge plasma, a discharge produced plasma (DPP), a laser produced plasma (LPP) and a dense plasma focus.

The reflecting surfaces 17 and 19 shown in FIG. 2 may, apart from combining optical power, at the same time perform an additional function. To illustrate the previous point, the reflective surface 17 may, as an example, in addition be coated with a substance that filters a particular wavelength (range) out of the radiation that is incident on it. Similar considerations of course hold for the reflective surface 19 and further reflective surfaces that may be present on the reflective member 15. Besides a spectral purity filter also a surface coating, a grating, or a specific absorption and diffraction structure may be present on the member 15. Filtering reflective surfaces are, e.g. described in European Patent Application 03078495.3, filed Nov. 6, 2003 in the name of the applicant, the contents of which are incorporated by reference.

It is also possible for the reflecting surface 17 and 19 to be curved. In this way, a beam of radiation that impinges on these surfaces will, after reflection on these reflecting surfaces 17, 19, be more convergent in character (for concave surfaces 17, 19) or be more divergent (for convex surfaces 17, 19) depending on the particular curvature of the respective surface.

The source SO may direct the combined beam of radiation to a further optical system 21 located downstream of the source SO. This optical system 21 may be a scrambler or an integrator, as discussed above.

Although the present invention has been described in the above in connection with the use of (extreme) ultraviolet radiation, the present invention is not limited to the use of this type of radiation. Other types of radiation may be contemplated. For example, visible radiation or infra red (IR) or X-ray radiation or radiation including particle beams may be used.

Combinations and/or variations on the above described modes of use or entirely different modes of use may also be employed.

What is claimed is:

1. A radiation system for multiplexing radiation, the radiation system comprising:
   an optical member with a first reflecting surface extending in a first direction and a second reflecting surface extending in a second different direction, the first reflecting surface configured to receive a first amount of radiation from a first radiation source configured to produce radiation and reflect the first amount, and the second reflecting surface configured to receive a second amount of radiation from a second radiation source configured to produce radiation and reflect the second amount,
   wherein the reflected first amount and the reflected second amount are multiplexed.

2. A radiation system according to claim 1, wherein the optical member includes a conical shape or a polygonal shaped cross-section.

3. A radiation system according to claim 1, wherein the first reflecting surface, or the second reflecting surface, or both, is positioned at grazing incidence to the first amount, or the second amount, or both, respectively.

4. A radiation system according to claim 1, further comprising the first radiation source and the second radiation source, the first radiation source configured to operate substantially simultaneously with the second radiation source.

5. A radiation system according to claim 1, further comprising the first radiation source and the second radiation source, the first radiation source configured to operate alternately with the second radiation source.

6. A radiation system according to claim 1, further comprising the first radiation source and the second radiation source, the first radiation source, or the second radiation source, or both, comprising an electrical discharge plasma, a Z pinch discharge plasma, a discharge produced plasma (DPP), a laser produced plasma (LPP), a dense plasma focus, an ultraviolet (UV) radiation source, an extreme ultra-violet (EUV) radiation source, an X-ray radiation source, a radiation source configured to generate a particle beam, a radiation source configured to generate an ion beam or a radiation source configured to generate an electron beam.

7. A radiation system according to claim 1, wherein the first reflecting surface, or the second reflecting surface, or both, comprises a spectral purity filter, a surface coating, a grating, a specific absorption or a diffraction structure.

8. A radiation system according to claim 1, wherein the first reflecting surface, or the second reflecting surface, or both, is curved.

9. A radiation system according to claim 1, further comprising:
an optical system configured to receive the reflected first amount from the optical member and the reflected second amount from the optical member.

10. A radiation system according to claim 9, wherein the optical system comprises an integrator or a scrambler.

11. A radiation system according to claim 10, wherein the first amount and the second amount are reflected parallel to each other.

12. A lithographic apparatus, comprising:
an illumination system configured to provide a beam of radiation;
a support configured to support a patterning device, the patterning device configured to impart the beam of radiation with a pattern in its cross-section;
a substrate table configured to hold a substrate;
a projection system configured to project the patterned beam onto a target portion of the substrate; and
a radiation system configured to multiplex radiation, the radiation system comprising:
an optical member with a first reflecting surface extending in a first direction and a second reflecting surface extending in a second different direction, the first reflecting surface configured to receive a first amount of radiation from a first radiation source configured to produce radiation and reflect the first amount, and the second reflecting surface configured to receive a second amount of radiation from a second radiation source configured to produce radiation and reflect the second amount,
wherein the reflected first amount and the reflected second amount are multiplexed.

13. A lithographic apparatus according to claim 12, wherein the optical member includes a conical shape or a polygonal shaped cross-section.

14. A lithographic apparatus according to claim 12, wherein the first reflecting surface, or the second reflecting surface, or both, is positioned at a grazing incidence to the first amount, or the second amount, or both, respectively.

15. A lithographic apparatus according to claim 12, further comprising the first radiation source and the second radiation source, the first radiation source configured to operate substantially simultaneously with the second radiation source.

16. A lithographic apparatus according to claim 12, further comprising the first radiation source and the second radiation source, the first radiation source configured to operate alternately with the second radiation source.

17. A lithographic apparatus according to claim 12, further comprising the first radiation source and the second radiation source, the first radiation source, or the second radiation source, or both, comprising an electrical discharge plasma, a Z pinch discharge plasma, a discharge produced plasma (DPP), a laser produced plasma (LPP), a dense plasma focus, an ultraviolet (UV) radiation source, an extreme ultra-violet (EUV) radiation source, an X-ray radiation source, a radiation source configured to generate a particle beam, a radiation source configured to generate an ion beam or a radiation source configured to generate an electron beam.

18. A lithographic apparatus according to claim 12, wherein the first reflecting surface, or the second reflecting surface, or both, comprises a spectral purity filter, a surface coating, a grating, a specific absorption or a diffraction structure.

19. A lithographic apparatus according to claim 12, wherein the first reflecting surface, or the second reflecting surface, or both, is curved.

20. A device manufacturing method, comprising:
providing a beam of radiation by
providing a first amount of radiation;
providing a second amount of radiation;
reflecting the first amount of radiation in a first direction; and
reflecting the second amount of radiation in a second direction, the first and second directions being different;
patterning the beam of radiation with a pattern in its cross-section; and
projecting the patterned beam of radiation onto a target portion of a substrate,
wherein the reflected first amount and the reflected second amount are multiplexed.

21. A radiation system for multiplexing radiation, the radiation system comprising:
a first radiation source configured to produce radiation;
a second radiation source configured to produce radiation; and
a reflector structure with a first reflecting surface extending in a first direction and a second reflecting surface extending in a second different direction, the first reflecting surface configured to receive a first amount of radiation from the first radiation source and reflect the first amount, and the second reflecting surface configured to receive a second amount of radiation from the second radiation source and reflect the second amount,
wherein the reflected first amount and the reflected second amount are multiplexed.

22. A radiation system according to claim 21, wherein the reflector structure includes a conical shape or a polygonal shaped cross-section.

* * * * *